United States Patent
Huang et al.

(10) Patent No.: US 6,414,385 B1
(45) Date of Patent: Jul. 2, 2002

(54) QUAD FLAT NON-LEAD PACKAGE OF SEMICONDUCTOR

(75) Inventors: Chien-Ping Huang, Hsinchu Hsien; Eric Ko, Taichung Hsien, both of (TW)

(73) Assignee: Siliconware Precisionindustries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/475,008

(22) Filed: Dec. 30, 1999

(51) Int. Cl.[7] .............................................. H01L 23/48
(52) U.S. Cl. ...................... 257/690; 257/712; 257/777; 257/782; 257/783; 257/784; 257/788; 257/796
(58) Field of Search .................. 257/690, 730, 257/787, 686, 783, 777, 696, 676, 707, 675, 666, 692, 711, 784, 731, 106; 438/106

(56) References Cited

U.S. PATENT DOCUMENTS

| | | | | |
|---|---|---|---|---|
| 5,705,851 A | * | 1/1998 | Mostafazadeh et al. | 257/675 |
| 5,904,497 A | * | 5/1999 | Akram | 438/106 |
| 6,002,181 A | * | 12/1999 | Yamada et al. | 257/787 |
| 6,072,239 A | * | 6/2000 | Yoneda et al. | 257/730 |
| 6,177,721 B1 | * | 1/2001 | Suh et al. | 257/686 |
| 6,184,580 B1 | * | 2/2001 | Lin | 257/712 |
| 6,198,171 B1 | * | 3/2001 | Huang et al. | 257/787 |

* cited by examiner

Primary Examiner—Olik Chaudhuri
Assistant Examiner—Dana Farahani
(74) Attorney, Agent, or Firm—J.C. Patents

(57) ABSTRACT

A Quad Flat Non-Lead package of semiconductor comprises a chip, a plurality of leads, and a molding compound. The chip has its active surface bonded to the die pad, and the area of the die pad is smaller than that of the chip in order to expose the bonding pad on the active surface of the chip. The leads are disposed at the periphery of the die pad. A plurality of bonding wires is used to electrically connect the top surface of the leads to the bonding pads. The molding compound encapsulates the chip, the die pad, the bonding wires, and a portion of the surface of the leads. In this way, the encapsulating process make the side surface of the lead, and the portion excluding the wire-bonding protruded zone of the bottom surface of the lead exposed in order to make the leads become the external connections of the package structure.

15 Claims, 4 Drawing Sheets

QUAD FLAT NON-LEAD PACKAGE OF SEMICONDUCTOR

BACKGROUND OF THE INVENTION

1. Field of the Invention

This invention relates to a Quad Flat Non-Lead package of semiconductor, and more particularly to a Quad Flat Non-Lead package of semiconductor for improving the heat-dissipating effect of the package.

2. Description of Related Art

In the information explosion of the world nowadays, the integrated circuit has become indispensable in our daily life, regardless of our daily life in food, clothing, lodging, transportation, education, and entertainment, the product assembled by various integrated circuit devices can be found everywhere. Following the evolution of the electronic technology, more sophisticate electronic products with user friendly and complicated functions are continuously progressing and changing. Nevertheless, in order to provide an ongoing convenience and comfortable usage, all the products are heading for the design trend of "Light, Thin, Short, and Small". In additions, the fabrication process of semiconductor has stepped into the mass production era of 0.18 μm integrated circuit, and semiconductor products with even higher integration have become at hands easily. As for packaging technology of the back stage, there are many successful cases on the development of precise package structure, i.e. chip scale package (CSP), wafer level package, and Multi-Chip Module(MCM) etc. However, in the respect of the assembly technology of devices, there is also a multi-level printed circuit board (PCB) with even higher density which make the integrated circuit (IC) package even closely and densely dispose on the printed circuit board.

FIG. 1 is a cross-sectional view of a Quad Flat Non-Lead package of a semiconductor according to the prior art and FIG. 2 is a bottom view corresponding to FIG. 1 according to the prior art. As shown in FIG. 1 and FIG. 2, the structure of the Quad Flat Non-Lead package which has disclosed in the U.S. Pat. No. 5,942,794 (Matsushita, 1999) is constructed on a lead frame and is having a die pad 100 surrounded by a multiple leads 102. The chip 104 includes an active surface 106 and a back surface 108. And a plurality of bonding pads 110 for external connections of the chip 104 is set up on the active surface 106. The chip 104 has its back surface 108 bonded to the die pad 100 by the use of an adhesive 112 while the bonding pads 110 are electrically connected to the leads 102 respectively by the use of bonding wires 114. What is more, a molding compound 116 normally encapsulates the whole chip 104, the die pad 100, the bonding wires 114, and the top surface 118a of the lead 102. This encapsulating process exposes the bottom surface 118b and the side surface 118c of the leads 102 for external connections of the whole package structure 120.

In the conventional structure of the Quad Flat Non-Lead package, the die pad 100 is upward offset in order to make the chip 104 and leads 102 positioned at different level of surfaces. An object of the upward offset of the die pad 100 is that the package can be applied in a relatively large chip in order to increase the packaging density, while the other object is to increase the bondability between the molding compound 116 and the lead frame. However, because of the demand for diminishing the thickness of the package, this conventional package structure is apt to expose the bonding wire 114 while encapsulating, thereby, the yield of the product become lower. Additionally, as the operating speed of the device of the integrated circuit becomes faster and faster nowadays, the heat generated increases accordingly, and since the conventional package structure is unable to provide a better way of heat dissipation, the performance of the electronic device will be affected.

SUMMARY OF THE INVENTION

Therefore, it is the first objective of the present invention to provide a Quad Flat Non-Lead package of semiconductor to improve the heat-dissipating effect of the package.

It is the second objective of the present invention to provide a Quad Flat Non-Lead package capable of increasing the yield.

It is the third objective of the present invention to provide a Quad Flat Non-Lead package to increase the packaging density.

In order to attain the foregoing and other objectives, the present invention provides a Quad Flat Non-Lead package which comprises a chip, a plurality of leads, and a molding compound. The chip is bonded through its active surface to the die pad, and the area of the die pad is smaller than that of the chip in order to expose the bonding pads on the active surface. The leads are disposed at the periphery of the die pad and are electrically connected by a plurality of bonding wires to the bonding pads. Additionally, the molding compound encapsulates the chip, the die pad, the bonding wires, and a portion of the leads so as to make the bottom surface and the side surface of the leads expose in order to become the external connections of the package structure.

According to a preferred embodiment of the present invention, the surface of the die pad excluding the surface that is bonded to the chip can be exposed in order to improve the heat-dissipating effect. Moreover, the back surface of the chip can also be exposed or add a heat spreader to further improve the heat-dissipating effect, and in the mean time to ground the heat spreader in order to improve the electrical performance. Furthermore, a stepped structure can be formed on the bottom surface of the lead by making use of the half-etching or coin method in order to strengthen the adhesive force between the lead and the molding compound.

Furthermore, in order to attain the foregoing and other objectives, the present invention also provides a stacked-chip Quad Flat Non-Lead package that comprises a first chip and a second chip bonded back to back each other. A die pad having an area smaller than that of the first chip is bonded to the active surface of the first chip and is to expose the bonding pad of the first chip. A plurality of leads is disposed at the periphery of the die pad with its bottom surface appears a stepped structure which make each of the leads possess a protruded wire-bonding portion having a relatively thin portion. The leads are electrically connected to the bonding pads of the first chip and the second chip respectively. The bonding pads of the first chip are connected to the top surface of the leads while the bonding pads of the second chip are connected to the protruded wire-bonding portion of the bottom surfaces of the leads. Then, the molding compound is used to encapsulate the first chip, the second chip, the die pad, the bonding wire, and a portion of the surface of the lead while a portion of the bottom surface excluding the protruded wire-bonding portion is exposed.

According to another preferred embodiment of the present invention, the surface of the die pad not bonding to the chip can be exposed in order to increase the heat-dissipating effect. In additions, the active surface of the second chip can also set up a heat spreader to further improve the heat-dissipating performance.

BRIEF DESCRIPTION OF DRAWINGS

The foregoing and other objectives, characteristics, and advantages of the present invention can be more fully understood by reading the following detailed description of the preferred embodiments, with reference made to the accompanying drawings as follows.

DETAILED DESCRIPTION OF PREFERRED EMBODIMENT

Figure 1:
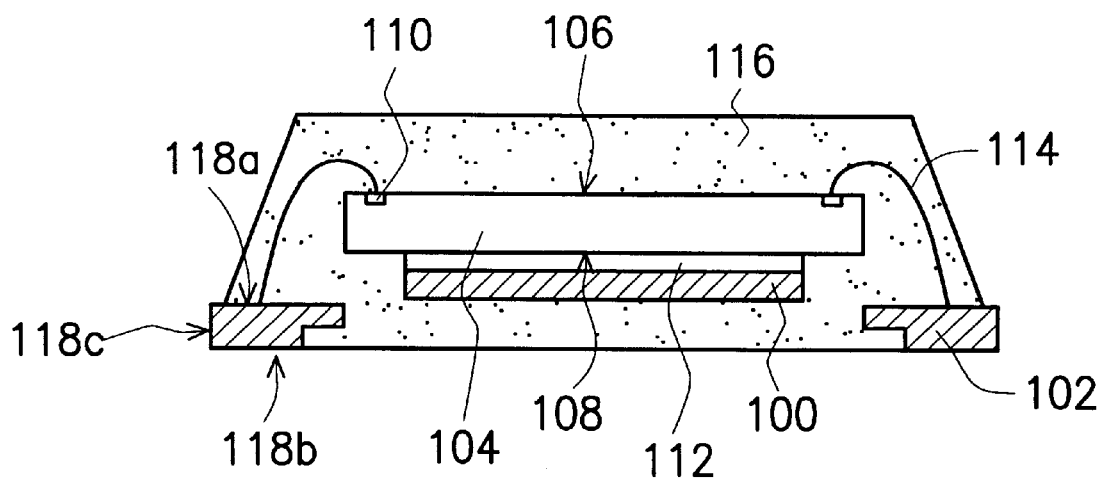
FIG. 1 is a cross-sectional view of a Quad Flat Non-Lead package of a semiconductor according to the prior art.
Figure 2:
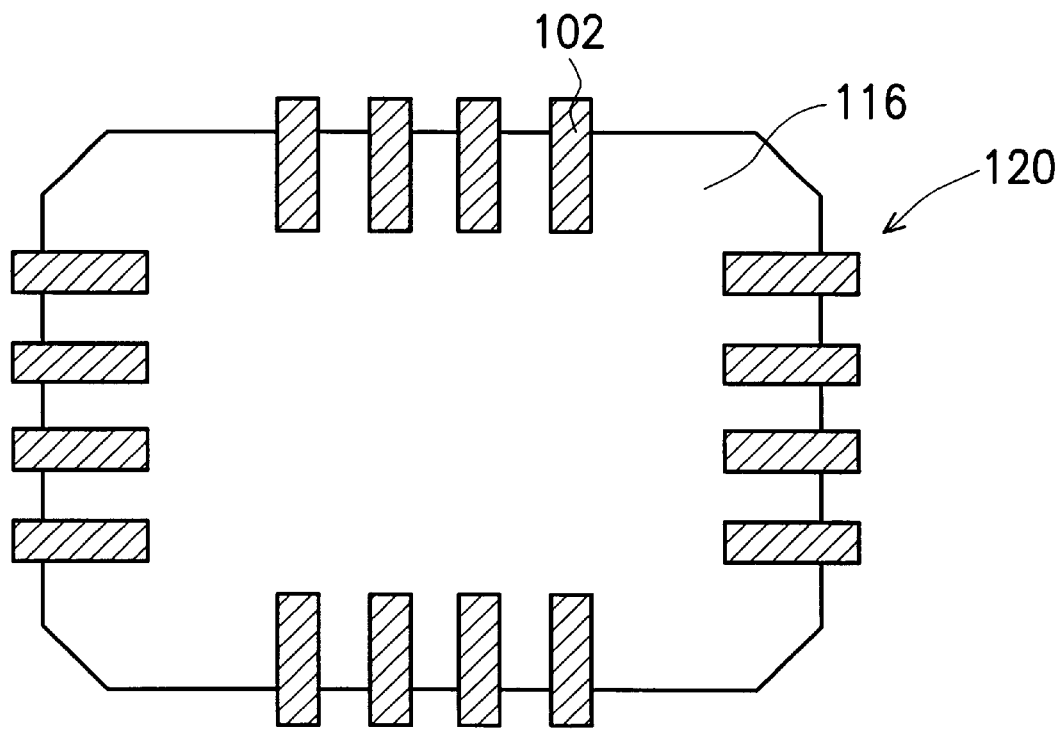
FIG. 2 is a bottom view corresponding to FIG. 1 according to the prior art.
Figure 3:
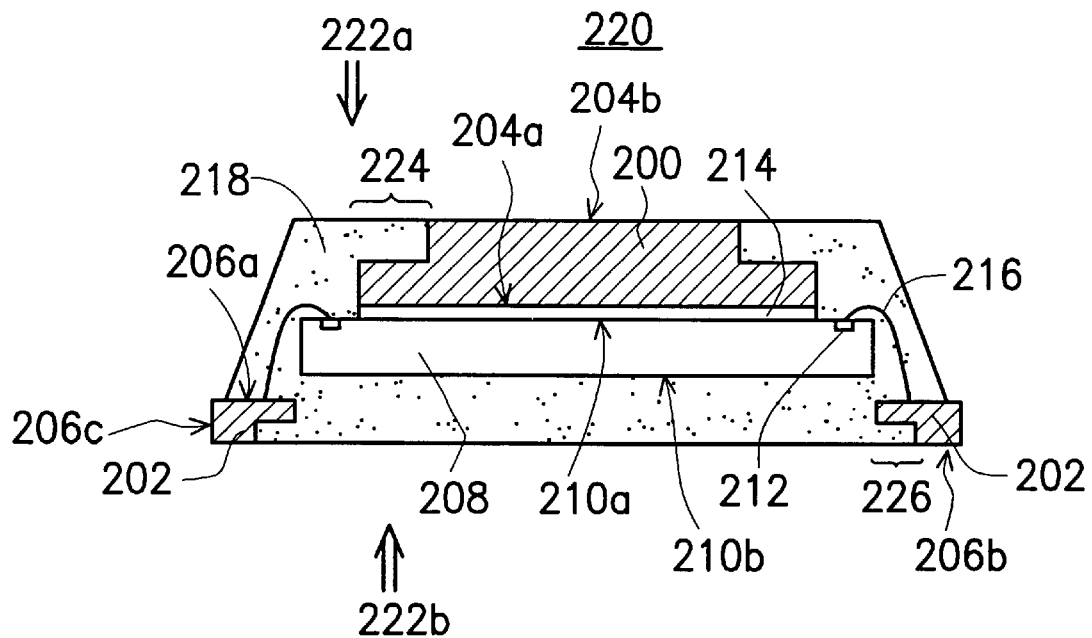
FIG. 3 is a cross-sectional view of the Quad Flat Non-Lead package of the first preferred embodiment according to the present invention.
Figure 3A:
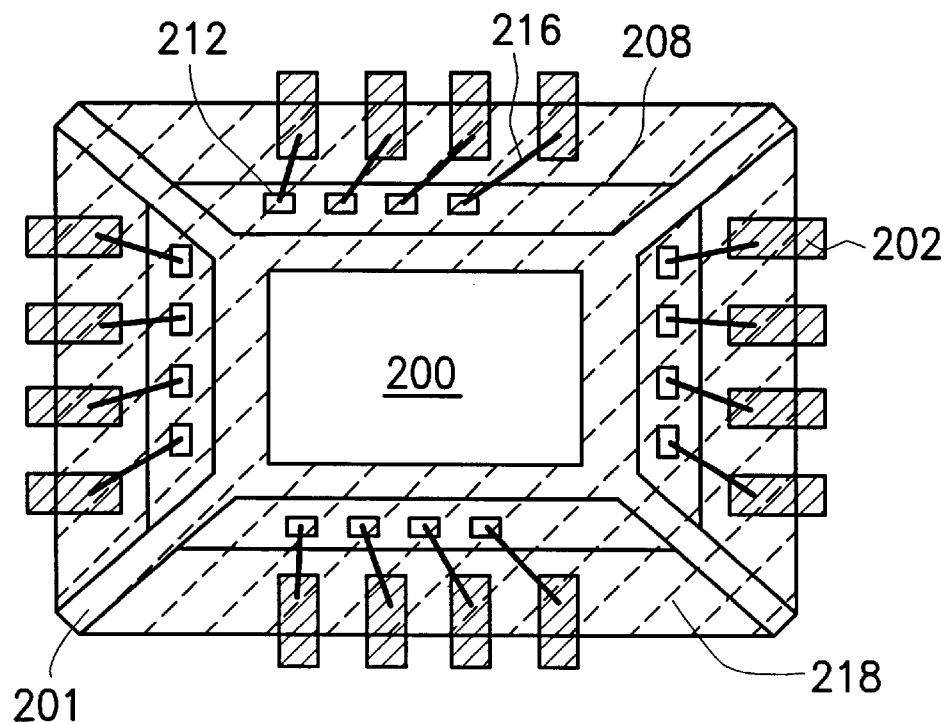
FIG. 3A is a top view corresponding to FIG. 3 of the present invention.

Shown in FIG. 3 is a cross-sectional view of the. Quad Flat Non-Lead package of the first preferred embodiment according to the present invention while FIG. 3A is a top view corresponding to FIG. 3 of the present invention. The Quad Flat Non-Lead package of semiconductor of the present invention is constructed on the lead frame that is constituted by a die pad 200 and a plurality of leads 202. The die pad 200 is disposed upset and connected to the lead frame through a support bar 201. The chip 208 has an active surface 210a and a corresponding bottom surface 210b wherein the active surface 210a has a plurality of bonding pads 212 for external connections of the chips 208. The area of the die pad 200 in the present invention is small than that of the chip 208. The first surface 204a of the die pad 200 is bonded to the active surface 210a of the chip through an adhesive 214 while those bonding pads 212 on the active surface 210a of the chip 208 are exposed. A well heat-conductive and electrically insulated material is a preferred one for the adhesive 214. The bonding pads 212 are electrically connected to the first surface 206a (the top surface) of the leads 202 by the bonding wires 216 such as Gold wires, Aluminum wires etc. The molding compound 218 encapsulates the chip 208, the die pad 200, bonding wires 216, and the first surface 206a of the leads 202 to form a package structure 220 which has a first side 222a (top surface) and a second side 222b (the bottom surface).

Since the die pad 200, which is bonded to the active surface 210a of the chip 208, provides the bonding wires 216 with accommodating space to assure the bond wires 216 without being exposed, the product yield can be increased. In additions, since the devices on the chip 208 are formed on the active surface 210a that is the primary source of heat generation, the heat accumulated on the chip 208 can be dissipated directly to the die pad 200 through the heat-conductive adhesive 214. Moreover, the second surface 204b of the die pad 200 is exposed on the first side 222a of the package structure 220 to enhance the heat-dissipating effect. Besides, since the area of the die pad 200 is smaller than that of the chip 208, the delamination problem resulted from the difference in the coefficient of thermal expansion (CTE) between the die pad 200 and the chip 208 can be reduced, thereby. the product reliability can be increased.

On the other hand, a portion of the second surface 206b (the bottom surface) excluding the wire-bonding protruded zone 226 of the lead 202 is exposed on the second side 222b of the package structure 220 for external connections. The side surface 206c of the lead 202 can also be exposed on the side edge of the package structure 220. Moreover, in order to enhance the bondability between the lead 202 and the molding compound 218, another stepped structure 226 can be formed on the second surface 206b of the lead 202. The stepped structure 226 can be formed by the use of half etching or coin methods to reduce the thickness of a portion of the lead 202 to increase the encapsulating area of the molding compound 218 on the surfaces of the lead 202.

Figure 4:
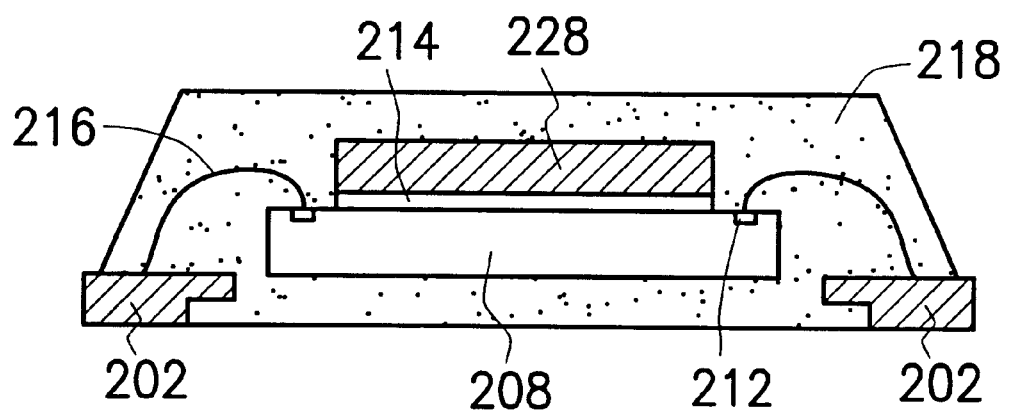
FIG. 4 is a cross-sectional view of a Quad Flat Non-Lead package of the second preferred embodiment of the present invention.

FIG. 4 illustrates a cross-sectional view of a Quad Flat Non-Lead package of the second preferred embodiment of the present invention. As shown in the FIG. 4, the die pad 228 can also be encapsulated by the molding compound 218 without exposing the top surface (the second surface 204b) to the first side 222a of the package structure 220 for those semiconductor devices having relatively low heat generation.

Figure 5:
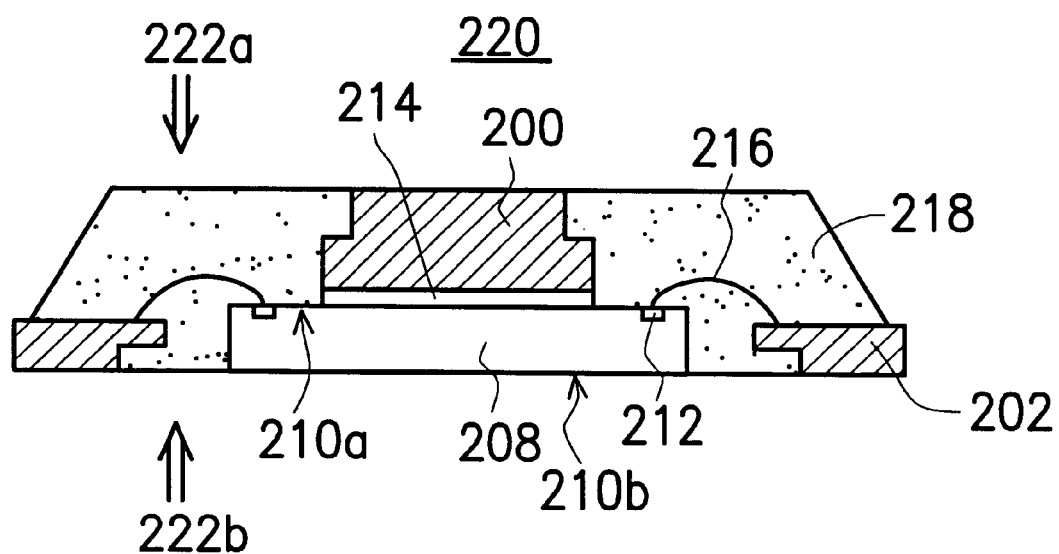
FIG. 5 is a cross-sectional view of a Quad Flat Non-Lead package of the third preferred embodiment of the present invention.

FIG. 5 is a cross-sectional view of a Quad Flat Non-Lead package of the third preferred embodiment of the present invention. As shown in FIG. 5, in order to further increase the heat-dissipating efficiency of the Quad Flat Non-Lead package according to FIG. 3, the back surface 210b of the chip 208 can be exposed to the second side 222b of the package structure 220.

Figure 6:
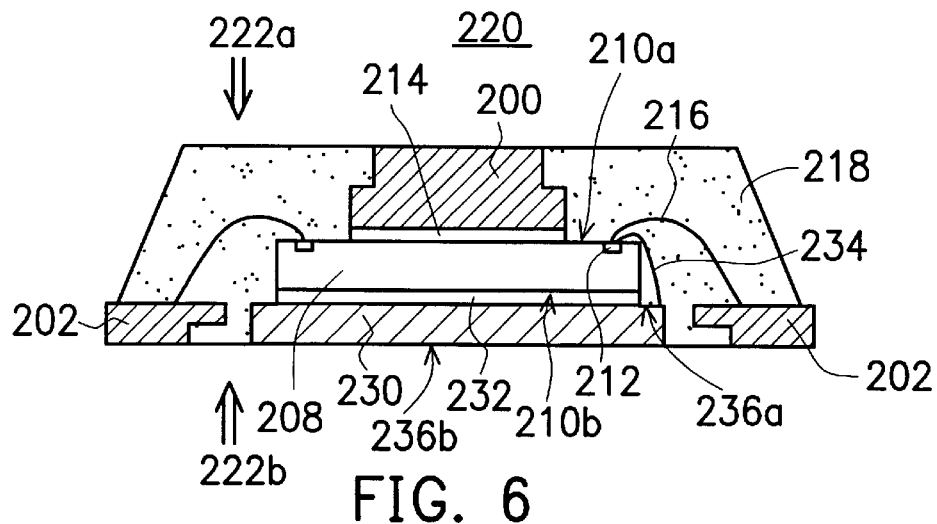
FIG. 6 is a cross-sectional view of a Quad Flat Non-Lead package of the fourth preferred embodiment of the present invention.

FIG. 6 illustrates a cross-sectional view of a Quad Flat Non-Lead package of the fourth preferred embodiment of the present invention. As shown in FIG. 6, the third preferred embodiment of the Quad Flat Non-Lead package of the present invention shown FIG. 5 can further improve its heat-dissipating efficiency by adding a heat spreader 230 on the back surface 210b of the chip 208. One surface 236a of the heat spreader 230 is bonded to the back surface 210b of the chip 208 by the use of a relatively better heat-conductive adhesive 232 while the other surface 236b is exposed on the second side 222b of the package structure 220. Besides, ground wires 234 can be employed to make the heat spreader 230 ground to enhance the electrical performance, e.g. to strengthen the capability to withstand the electrostatic damage or to protect the devices from external signal interference etc.

Figure 7:
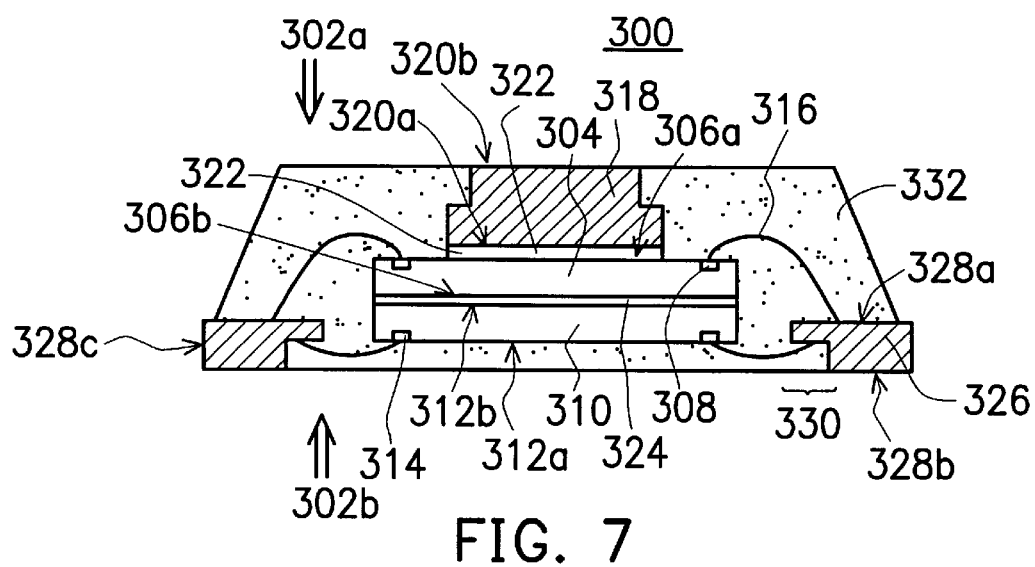
FIG. 7 is a cross-sectional view of a stacked-chip Quad Flat Non-Lead package of the fifth preferred embodiment of the present invention.

FIG. 7 is a cross-sectional view of a stacked-chip Quad Flat Non-Lead package of the fifth preferred embodiment of the present invention. The package structure of the present invention can also be applied in a package having dual chips. As shown in FIG. 7, a first chip 304 and a second chip 310 are bonded each other by their corresponding first back surface 306b and second back surface 312b respectively by the use of an adhesive 324. The die pad 318 having its area smaller than that of the first chip 304 has its first surface 320a bonded to the active surface 306a of the first chip 304 by an adhesive 322. And the first bonding pads 308 on the active surface 306a of the first chip 304 are exposed. The lead 326 has a first surface 328a and a second surface 328b wherein the second surface 328b of the lead 326 appears a stepped structure to form a protruded wire-bonding portion 330 with relatively thin in thickness in order to facilitate the wire-bonding work. The first bonding pad 308 on the active surface 306a of the first chip 304 is electrically connected to the first surface 328a of the lead 326 respectively by the bonding wires 316. Likewise, the second bonding pads 314 on the active surface 312a of the second chip 310 is electrically connected to the second surface 328b of the lead 326 respectively by the bonding wires 316.

The molding compound 332 encapsulates the first chip 304, the second chip 310, the bonding wires 316, the die pad 318, the first surface 328a of the lead 326, and the protruded wire-bonding portion 330 of the second surface 328b of the lead 326 to constitute a package structure 300. The package structure 300 has a first side 302a and a second side 302b, and in order to improve the heat-dissipating effect on the first side 302a of the package structure 300, the second surface 320b of the die pad 318 can be exposed. As for the lead 326, the second surface 328b excluding the area of the protruded wire bonding portion 330 is exposed on the second side 302b of the package structure 300. And the side surface 328c of the lead 326 is also exposed at the side edge of the package structure 300. The purpose of exposing these surface of the leads 326 is to form external connections of the package structure 300.

Figure 8:
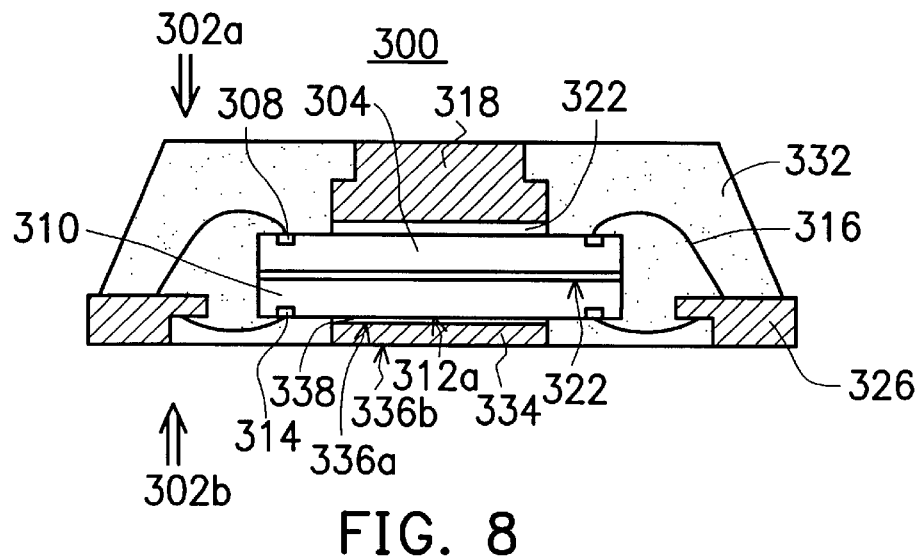
FIG. 8 is a cross-sectional view of a stacked-chip Quad Flat Non-Lead package of the sixth preferred embodiment of the present invention.

FIG. 8 is a cross-sectional view of a stacked-chip Quad Flat Non-Lead package of the sixth preferred embodiment of the present invention. As shown in FIG. 8, the package structure can further improve its heat-dissipating effect by adding a heat spreader 334 on the second active surface 312a of the second chip 310. Since the area of the heat spreader 334 is smaller than that of the second chip 310, the second bonding pads 314 will not be covered. A surface 336a of the heat spreader 334 is bonded to the second active surface 312a of the second chip 310 by the use of a relatively better heat-conductive adhesive 338 while the other surface 336b is exposed on the second side 302b of the package structure 300.

To summarize the foregoing illustration disclosed by preferred embodiments of the present invention, the Quad Flat Non-Lead package of semiconductor of the present invention comprise the following advantages:
1. The Quad Flat Non-Lead package of semiconductor of the present invention can lower the heat resistance to improve the heat-dissipating effect. This is because that the die pad is bonded to the active surface of the chip directly.
2. The Quad Flat Non-Lead package of semiconductor of the present invention can improve the heat-dissipating effect of the package structure to further increase the performance of the device. This is because that the Quad Flat Non-Lead package can optionally select to expose the die pad or the back surface of the chip or add a heat spreader.
3. The Quad Flat Non-Lead package of semiconductor of the present invention can provide the accommodating space for the bonding wire to reduce the overall thickness of the package without exposing the bonding wires while performing encapsulating. Therefore, the package can increase the yield of the product since the die pad is bonded to the active surface of the chip.
4. The Quad Flat Non-Lead package of semiconductor of the present invention can contain two chips in the same Quad Flat Non-Lead package while providing good ways of heat-dissipating, thereby, the package can increase the density of packaging and can improve the performance of the device.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A Quad Flat Non-Lead package of semiconductor comprising:
   a chip having an active surface and a corresponding back surface opposite to the first surface, wherein the active surface comprises a plurality of bonding pad;
   a die pad having a first surface and a corresponding second surface, wherein the first surface of the die pad is smaller than the area of the chip but larger than the second surface of the die pad and the first surface of the die pad is bonded to the active surface of the chip while those bonding pads are exposed;
   a plurality of leads spaced around the chip;
   a plurality of bonding wires, electrically connected those bonding pads to a top surface of those leads respectively; and
   a molding compound for encapsulating the chip, the die pad, those bonding wires, and the leads to form a package structure, such that at least one surface of each lead is exposed from a bottom surface of the package structure.

2. The Quad Flat Non-lead package of semiconductor of claim 1, wherein the molding compound further exposes the second surface of the die pad.

3. The Quad Flat Non-Lead package of semiconductor of claim 1 wherein the molding compound encapsulates the whole die pad.

4. The Quad Flat Non-lead package of semiconductor of claim 1, wherein the molding compound further exposes the back surface of the chip.

5. The Quad Flat Non-lead package of semiconductor of claim 1 wherein the molding compound further exposes the side surfaces of those leads on the side edge of the package structure.

6. The Quad Flat Non-lead package of semiconductor of claim 1, further comprises a heat spreader that is bonded to the back surface of the chip.

7. The Quad Flat Non-Lead package of semiconductor of claim 6 wherein the heat spreader is grounded.

8. The Quad Flat Non-Lead package of semiconductor of claim 1 wherein the second surface of the lead has a stepped configuration which makes a relatively thin portion of the lead be covered by the molding compound while a relatively thick portion is exposed to air.

9. A stacked-chip Quad Flat Non-Lead package of semiconductor comprising:
   a first chip having a first active surface and a corresponding first back surface wherein the first active surface comprises a plurality of a first bonding pads on a periphery thereof;
   a second chip having a second active surface and a corresponding second back surface wherein the second active surface comprises a plurality of second bonding pads on a periphery thereof, and the first back surface of the first chip is bonded to the second back surface of the second chip;
   a die pad having a first surface and a corresponding second surface, wherein the first surface of the die pad is smaller than an area of the chip but larger than the second surface of the die pad and the first surface of the die pad is bonded to the first active surface of the first chip, leaving those first bonding pads exposed;

a plurality of leads spaced around the chip and having a first surface and a corresponding second surface;

a plurality of bonding wires, electrically connecting the first bonding pad to the first surface of the lead and electrically connecting the second bonding pad to the second surface of the lead; and a molding compound encapsulating the first chip, the second chip, the die pad, and electric connection between the first chip and the second chip, such that the second surface of the lead except the portion for electric connection to the chip is exposed.

10. The stacked-chip Quad Flat Non-Lead package of semiconductor of claim 9 wherein the molding compound further express the second surface of the die pad on the first side of the package structure.

11. The stacked-chip Quad Flat Non-Lead package of semiconductor of claim 9 wherein the molding compound encapsulates the whole die pad.

12. The stacked-chip Quad Flat Non-Lead package of semiconductor of claim 9 wherein the molding compound further exposes the side surfaces of those leads on the side edge of the package structure.

13. The Quad Flat Non-lead package of semiconductor of claim 9, further comprising a heat spreader, an area of which is smaller than the area of the second chip, and the heat spreader is bonded to the second active surface of the second chip without covering those bonding pads while an opposite non-bonded surface of the heat spreader is exposed.

14. The stacked-chip Quad Flat Non-Lead package of semiconductor of claim 9, wherein the second surface of the lead has a stepped configuration in which a relatively thin portion thereof is used for wire bonding.

15. A Quad Flat Non-Lead package of semiconductor comprising:

a chip having an active surface and a corresponding back surface opposite to the first surface, wherein the active surface comprises a plurality of bonding pad;

a die pad having a first surface and a corresponding second surface, wherein the first surface of the die pad is smaller than the area of the chip but larger than the second surface of the die pad such that the die pad has a step configuration at both sidewalls, and wherein the first surface of the die pad is bonded to the active surface of the chip while those bonding pads exposed;

a plurality of leads spaced around the chip;

a plurality of bonding wires, electrically connected those bonding pads to a top surface of those leads respectively; and a molding compound for encapsulating the chip, the die pad, those bonding wires, and the leads to form a package structure, such that at least one surface of each lead is exposed from a bottom surface of the package structure.

* * * * *